United States Patent [19]
Todd et al.

[11] Patent Number: 5,909,012
[45] Date of Patent: *Jun. 1, 1999

[54] METHOD OF MAKING A THREE-DIMENSIONAL PART WITH BURIED CONDUCTORS

[75] Inventors: Michael George Todd, South Lyon; Charles Frederick Schweitzer, Novi; Robert Edward Belke, Jr., West Bloomfield; Tianmin Zheng, Ann Arbor, all of Mich.

[73] Assignee: Ford Motor Company, Dearborn, Mich.

[*] Notice: This patent issued on a continued prosecution application filed under 37 CFR 1.53(d), and is subject to the twenty year patent term provisions of 35 U.S.C. 154(a)(2).

[21] Appl. No.: 08/730,618

[22] Filed: Oct. 21, 1996

[51] Int. Cl.$^6$ ....................................................... H05K 1/11
[52] U.S. Cl. ........................... 174/266; 361/823; 439/654
[58] Field of Search ................................... 174/250, 251, 174/261, 262, 266, 35 R, 36, 117 FF; 361/822, 826, 823; 439/931, 650, 654

[56] References Cited

U.S. PATENT DOCUMENTS

| | | | |
|---|---|---|---|
| 3,403,438 | 10/1968 | Best et al. ............................. | 174/261 X |
| 3,543,198 | 11/1970 | Stopper ................................. | 174/36 X |
| 3,576,669 | 4/1971 | Filip ..................................... | 117/212 |
| 3,661,638 | 5/1972 | Lemecha .............................. | 117/212 |
| 3,690,943 | 9/1972 | Papiano ................................ | 117/212 |
| 3,784,452 | 1/1974 | Martens et al. ..................... | 204/26 |
| 3,873,756 | 3/1975 | Gall et al. ............................ | 174/68.5 |
| 4,064,290 | 12/1977 | Ebel et al. ............................ | 427/97 |
| 4,157,452 | 6/1979 | Pignataro et al. ................... | 174/36 |
| 4,263,341 | 4/1981 | Martyniak ........................... | 427/97 |
| 4,403,818 | 9/1983 | Kleinbhl .............................. | 339/10 |
| 4,441,088 | 4/1984 | Anderson ........................ | 174/36 X |
| 4,478,882 | 10/1984 | Roberto ............................... | 427/97 |
| 4,513,170 | 4/1985 | Apodaca .............................. | 174/36 |
| 4,710,395 | 12/1987 | Young et al. ........................ | 427/8 |
| 4,734,296 | 3/1988 | Schramm ............................. | 427/97 |
| 5,510,582 | 4/1996 | Shirai et al. ........................ | 174/266 |
| 5,539,148 | 7/1996 | Konishi et al. ..................... | 174/35 R |
| 5,600,099 | 2/1997 | Crotzer et al. ...................... | 174/257 |

OTHER PUBLICATIONS

Daniel N. Lapedes "Dictionary of Scientific and Technical Terms", 1978.

*Primary Examiner*—Kristine Kincaid
*Assistant Examiner*—Chau N. Nguyen
*Attorney, Agent, or Firm*—Leslie C. Hodges; Roger L. May

[57] ABSTRACT

A gas assisted injection molded part includes internal cavities extending between two surfaces of the part. The cavities are plated for electrical conductivity after a surface cleaning and etching process. The part may be an automobile instrument panel wherein the internal cavities are plated to create a series of "bus" conductor lines. These lines carry power, ground and/or electrical signals over relatively large distances, allowing other components to attach at points along the structure eliminating the need for discrete wiring and wire harness interconnect assemblies.

11 Claims, 2 Drawing Sheets

*Fig. 3*
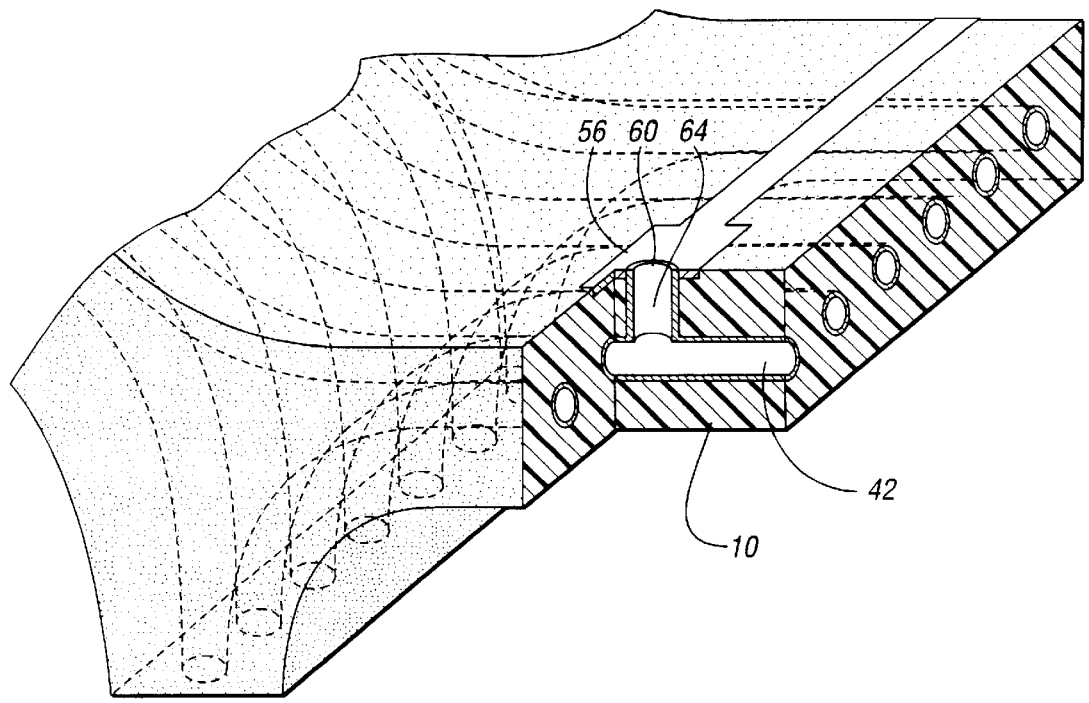
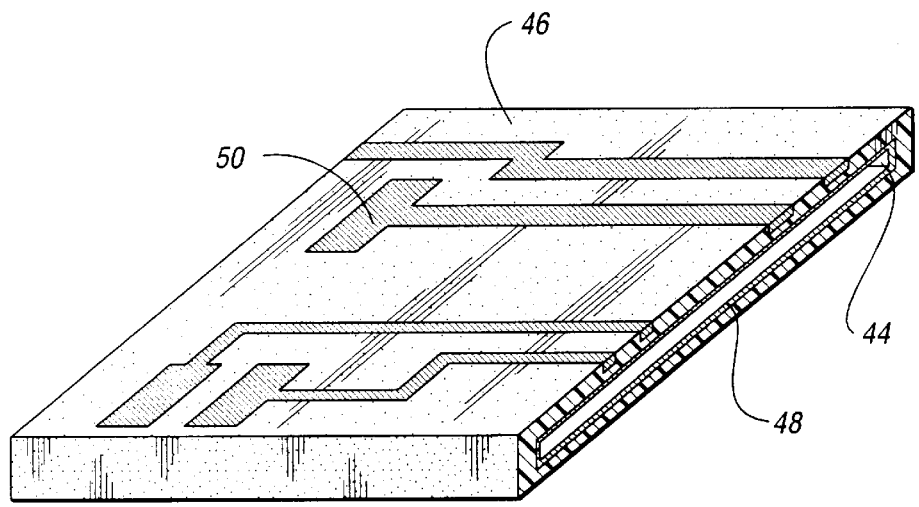
*Fig. 4*

METHOD OF MAKING A THREE-DIMENSIONAL PART WITH BURIED CONDUCTORS

TECHNICAL FIELD

This invention relates to the manufacture of three-dimensional molded plastic parts used for supporting interconnected electrical components and, more particularly, to a manufacturing process that uses electroless metal deposition to plate internal cavities in plastic parts, such as those formed by gas assist injection molding, to form an electrically insulative base substrate containing internal or buried conductor for interconnecting such components.

BACKGROUND ART

Plating of electrical conductors on mechanically functional three-dimensional plastic parts is gaining increased acceptance in the mechanical and electrical design communities. These electrical/mechanical hybrid devices are generally known as "molded interconnect devices", or MIDs. There are a number of methods known for the manufacture of MIDs including electroplating, electroless plating, foil embossing, and circuit film in-molding. However, one of the limitation in each of these technologies is that they are not capable of plating more than a single electrical layer on each plastic surface. This is a severe limitation since most circuits designed today take advantage of multiple electrical conductor layers (for example, multi-layer FR-4 circuits).

Manufacturing methods such as gas assist injection molding, blow-molding and lost-core molding produce complex three-dimensional plastic or composite parts having internal cavities void of plastic material. These cavities generally serve the purposes of providing required structural support, reducing overall material usage in a part, and preventing poor molding features such as "sinks" or short shots.

SUMMARY OF THE INVENTION

In accordance with the present invention, the limitations of the prior art are overcome by taking advantage of the internal cavities in the aforementioned plastic molded components by plating the internal cavities to form current carrying conductors that may be suitably connected between a source and an output device. The internal cavities to be plated are subjected to a surface cleaning and etching process followed by electroless deposition of the metal conductor. The invention thus produces electrically conductive regions or traces inside a three-dimensional part that can be used as (1) electrical conductors for power, ground or signal transfer within the part, or (2) EMI shielding between one or more conductive circuit layers formed on the external surfaces of the molded part.

BRIEF DESCRIPTION OF THE DRAWINGS

A more complete understanding of the present invention may be had from the following detailed description which should be read in conjunction with the drawings in which:

FIG. 3 is an enlarged partial cross-sectional view of a portion of the part showing the plating on the inner wall of the cavities and the electrical connection between surface and buried conductors; and FIG. 4 is a plan view of a second part produced in accordance with the present invention.

DETAILED DESCRIPTION OF PREFERRED EMBODIMENT

Figure 1:
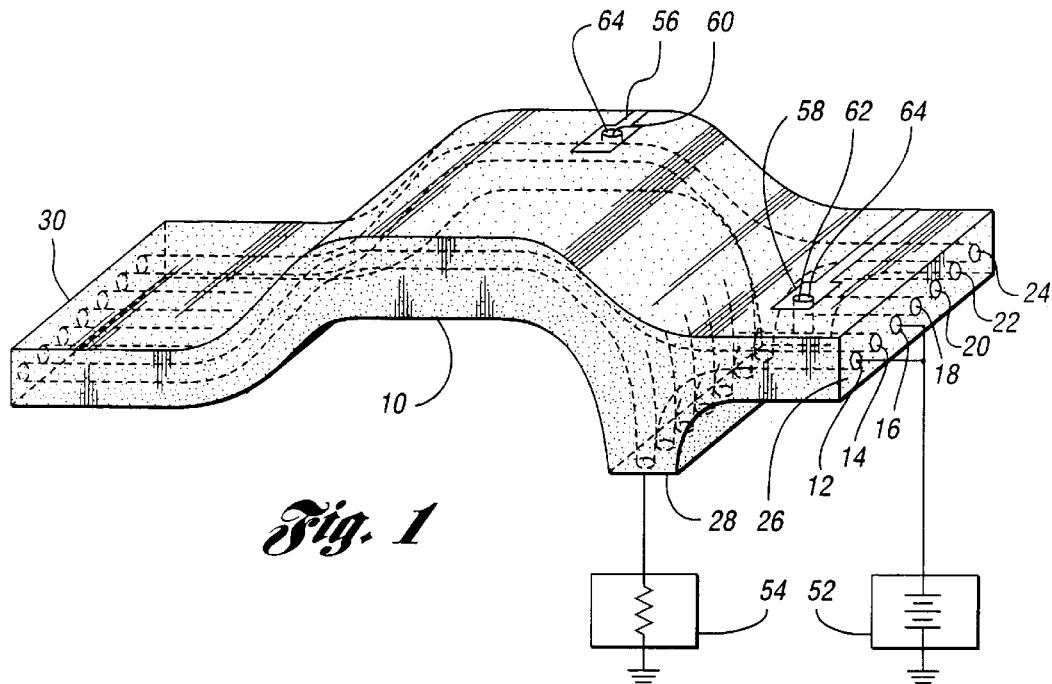
FIG. 1 is a plan view of a part produced in accordance with the present invention.

Referring now to the drawings and initially to FIG. 1, a molded plastic substrate or part generally designated 10 which may, for example, represent a portion of an automobile instrument panel. The part 10 has a generally arcuate cross-section and a longitudinal dimension and includes a plurality of elongated, generally cylindrically shaped cavities 12–24 extending from one surface 26 to other surfaces 28 and 30 across substantially all of the longitudinal dimension. The cavities 12–24 have a high aspect ratio, that is, the cavities have a relatively large depth to diameter ratio. The part 10 with the internal cavities is produced by a suitable injection molding process, preferably gas assist injection molding. This process includes a partial injection of polymer melt in the mold cavity, followed by introducing compressed gas to create the hollow cavities 12–24.

In order to plate these internal cavities for electrical conductivity, it is first necessary to prepare the surface of the part to be plated. This preparation require a surface cleaning and etching process which is well known and need not be described in detail. These processes create microscopic irregularities on the plastic surface to increase plating adhesion.

Figure 2:
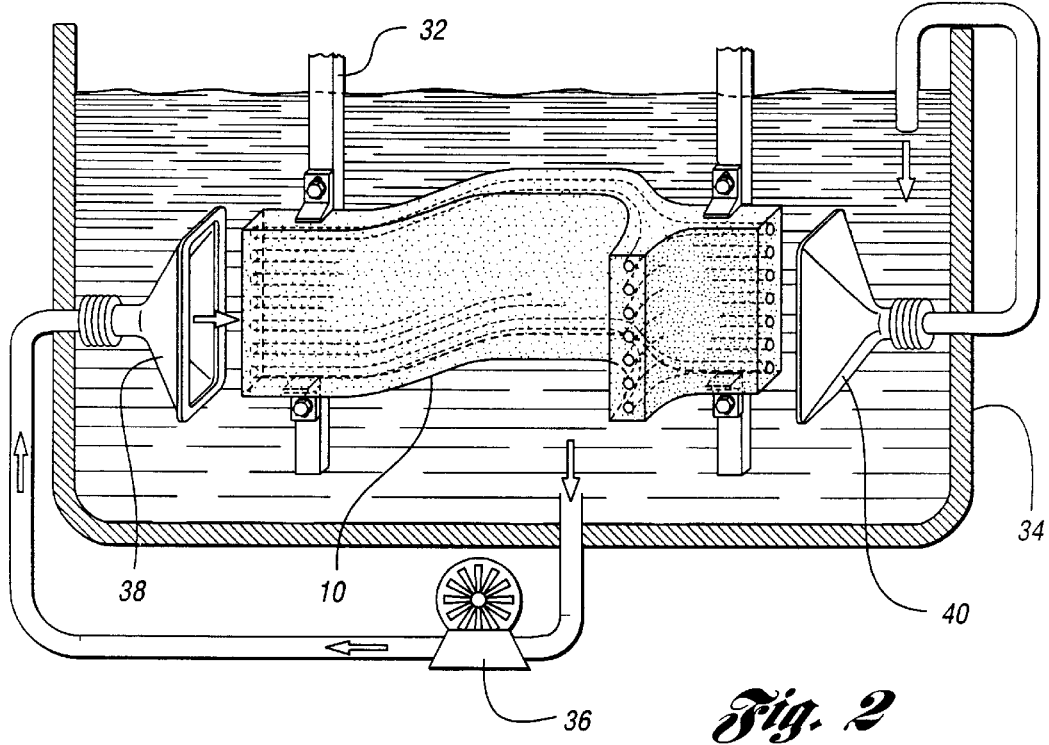
FIG. 2 is a pictorial representation of the plating process used to plate conductive material in the cavities of the three-dimensional molded part.

The preparation step is followed by electroless deposition of the metal conductor in the manner shown in FIG. 2. Electroless plating baths are well known that deposit copper, nickel or gold. In order to effectively plate the internal cavities of these parts using an electroless metal plating system, it is desirable to ensure adequate flow rates of the plating solution through the internal cavities. This may be achieved by positioning the part 10, using a suitable support structure 32, within a plating tank 34 such that the openings of the cavities align with the flow of the plating solution from a circulation pump 36 through bellows 38 and 40. The plating solution adheres to the inner walls of the cavities as best shown in FIG. 3 at 42. Alternately, "plating lines" consisting of plastic or metal tubes through which plating solution flows may be connected to a circulation pump on one end, and the part cavities on the other, thereby pumping solution directly through the internal cavities of the molded part. This latter configuration may also be utilized to selectively plate only the internal cavities of the part (without plating the exterior), or to plate only selected internal cavities.

Holes may be designed into the mold or drilled to provide points for interconnection between exterior conductor (not shown) that may be placed on the exterior surface of the part, thereby creating integral plate through holes.

Depending upon the configuration of the molded part, the internal plated cavities may serve to function as electrical conductor lines for the carrying of electrical current or signals. Because the entire wall of the cavity is plated, as indicated in FIG. 3 at 42, relatively high current carrying capacity traces may be created using a small space, due to the large surface area of the cavities. The cavities generally follows the arcuate cross-section of the part and each cavity terminates in an opening at the surface of the part.

As shown in FIG. 4, a large flat cavity area 44 may be created within a molded part 46. This large area, when plated as at 48, may serve as an effective EMI (electromagnetic interference) shield. The plated area shields exterior surface carrying conductors 50 from the environment, or may shield one exterior surface carrying conductor from another exterior surface carrying conductor (not shown).

One of numerous applications of the present invention is an automobile instrument panel wherein the internal cavities may be plated to create a series of "bus" conductor lines. These lines would carry power, ground and/or electrical signals over relatively large distances, allowing other components to attach at points along the structure. This structure eliminates the need for discrete wiring and wire harness interconnect assemblies. This use is shown schematically in FIG. 1, where a battery 52 is electrically connected with a resistor or other load, generally indicated at 54, through the conductive material plated on the walls of the cavity 12. Conductors 56 and 58 are shown as formed on the surface of the part 10 and may connect other loads through drilled or molded holes 60 and 62 in the part 10. As best shown in FIG. 3, the holes 60 and 62 are plated as at 64 and may connect the surface conductors with a buried or internal conductor and thence to the battery 52.

While the best mode for carrying out the present invention has been described in detail, those familiar with the art to which this invention relates will recognize various alternative designs and embodiments for practicing the invention as defined by the following claims.

What is claimed is:

1. An interconnect device formed of molded plastic material, said device having an arcuate cross-section, a longitudinal dimension and including:

a plurality of internal cavities having a high aspect ratio and extending between first and second surfaces across substantially all of said longitudinal dimension of said device;

said cavities plated with a conductive material to form internal conductors;

at least one surface conductor formed on a third surface of said device;

means connecting said surface conductor with at least one of said internal conductors to establish a path for carrying current through said at least one of said internal conductors and said surface conductor.

2. The device of claim 1 wherein one or more of said conductors connects a source of current with a load.

3. The device of claim 1, wherein the means connecting said surface conductor with said at least one of said internal conductors comprises a plated hole in said material.

4. The device of claim 1, wherein said cavities follow the arcuate cross-section of the device.

5. The device of claim 4, wherein each cavity terminates in an opening at each of said first and second surfaces.

6. The device of claim 5, wherein said device is a vehicle instrument panel.

7. An interconnect device formed of molded plastic material, said device having an arcuate cross-section and a longitudinal dimension and including:

a plurality of internal cavities having a relatively large depth to diameter ratio, extending between first and second surfaces across substantially all of said longitudinal dimension of said device;

said cavities plated with a conductive material to form internal conductors that follow the arcuate cross-section of the device;

at least one surface conductor formed on a third surface of said device;

means connecting said surface conductor with at least one of said internal conductors to establish a path for carrying current through said at least one of said internal conductors and said surface conductor.

8. The device of claim 7, wherein at least another one of said internal conductors is connected with a source of current and is also connected with a load.

9. The device of claim 7, wherein the means connecting said surface conductor with said at least one of said internal conductors comprises a plated hole in said material.

10. The device of claim 7, wherein each cavity terminates in an opening at each of said first and second surfaces.

11. The device of claim 7, wherein said device is a vehicle instrument panel.

* * * * *